United States Patent [19]
Kuo et al.

[11] Patent Number: 5,530,386
[45] Date of Patent: Jun. 25, 1996

[54] STORAGE CHARGE REDUCTION CIRCUIT FOR BIPOLAR INPUT/OUTPUT DEVICES

[75] Inventors: James R. Kuo, Cupertino; Shurong Zheng, Sunnyvale, both of Calif.

[73] Assignee: National Semiconductor Corporation, Santa Clara, Calif.

[21] Appl. No.: 157,712

[22] Filed: Nov. 24, 1993

[51] Int. Cl.$^6$ .............................. H03K 5/08; H03K 17/60
[52] U.S. Cl. ........................ 327/109; 327/313; 327/328; 327/378; 327/389; 327/432; 327/490; 327/478; 327/543; 327/108
[58] Field of Search .................................. 327/309, 310, 327/313, 321, 324, 328, 374, 375, 376, 377, 378, 379, 380, 381, 382, 384, 389, 419, 432, 478, 482, 490, 530, 538, 539, 540, 541, 542, 543, 579, 109, 108

[56] References Cited

U.S. PATENT DOCUMENTS

| | | | |
|---|---|---|---|
| 3,333,113 | 7/1967 | Cole et al. | 307/88.5 |
| 4,254,501 | 3/1981 | Griffith et al. | 375/9 |
| 4,385,394 | 5/1983 | Pace | 375/36 |
| 4,393,494 | 7/1983 | Belforte et al. | 370/27 |
| 4,507,573 | 3/1985 | Nagano | 327/542 |
| 4,553,044 | 11/1985 | Bittner | 327/109 |
| 4,581,542 | 4/1986 | Steigerwald | 327/432 |
| 4,647,912 | 3/1987 | Bates et al. | 340/825.5 |
| 4,656,414 | 4/1987 | Morud | 327/109 |
| 4,665,547 | 5/1987 | Tuhy, Jr. | 327/327 |
| 4,751,404 | 6/1988 | Yuen | 307/297 |
| 4,799,224 | 1/1989 | Bottacchi et al. | 327/109 |
| 4,825,402 | 4/1989 | Jalali | 364/900 |
| 4,855,622 | 8/1989 | Johnson | 307/456 |
| 4,912,347 | 3/1990 | Morris | 327/541 |
| 4,929,941 | 5/1990 | Lecocq | 340/825.14 |
| 4,972,106 | 11/1990 | Ruijs | 307/473 |
| 4,980,579 | 12/1990 | McDonald et al. | 307/455 |
| 5,015,888 | 5/1991 | Ovens | 307/475 |
| 5,017,813 | 5/1991 | Galbraith et al. | 307/475 |
| 5,019,728 | 5/1991 | Sanwo et al. | 307/475 |
| 5,023,487 | 6/1991 | Wellheuser et al. | 307/475 |
| 5,023,488 | 6/1991 | Gunning | 307/475 |
| 5,034,632 | 7/1991 | Jansson et al. | 307/456 |
| 5,038,053 | 8/1991 | Djenguerian et al. | 327/540 |
| 5,041,743 | 8/1991 | Matsumoto | 307/455 |
| 5,144,169 | 9/1992 | Hirabayashi et al. | 327/490 |
| 5,235,222 | 8/1993 | Kondoh et al. | 327/541 |
| 5,300,837 | 4/1994 | Fischer | 327/538 |

FOREIGN PATENT DOCUMENTS

WO85/04774  10/1985  WIPO ................ H03K 19/086

OTHER PUBLICATIONS

Paul R. Gray and Robert G. Meyer, "Analysis and Design of Analog Integrated Circuits", 1977, pp. 254–261.

Primary Examiner—Terry Cunningham
Attorney, Agent, or Firm—Limbach & Limbach

[57] ABSTRACT

A storage charge reduction circuit for reducing the storage charge of a first bipolar transistor. The circuit includes a second field effect transistor connectable between the base of the first bipolar transistor and ground for conducting a compensation current from the base of the first bipolar transistor to ground. A third bipolar transistor is connected in series with a first resistor for conducting a first current from a first voltage supply through the first resistor to ground. Current mirror circuitry sets the gate-source voltage of the second field effect transistor so that the compensation current is proportional to the first current. The first current and the compensation current increase when temperature increases. In a preferred embodiment, the storage charge reduction circuit is used in a transmission line driver. The driver includes an output bipolar transistor connectable between the transmission line and ground for conducting current from the transmission line to ground. An input stage charges and discharges the base of the output bipolar transistor. The storage charge reduction stage conducts a compensation current from the base of the output bipolar transistor to ground to reduce the storage charge of a first bipolar transistor.

17 Claims, 4 Drawing Sheets

STORAGE CHARGE REDUCTION CIRCUIT FOR BIPOLAR INPUT/OUTPUT DEVICES

BACKGROUND OF THE INVENTION

1. Field of the Invention

The present invention relates to line interface devices, and, in particular, to a storage charge reduction circuit that can be used to reduce the storage charge of a bipolar transistor of an input/output device.

2. Description of the Related Art

Data transceivers (TRANSmitter/reCEIVER) are typically used to interface Very Large Scale Integrated (VLSI) circuits to transmission mediums. The transmission mediums are generally collected together to form buses. The number, size and types of buses that are used in a digital system may be designed for general-purpose applications or according to a more specific, industry standard data-communications configuration. One such industry standard is the so-called IEEE 896.1 Futurebus+ standard. The Futurebus+ standard provides a protocol for implementing an internal computer bus architecture.

The transmission mediums are typically traces which are formed on the printed circuit board (PCB) substrates of daughter and mother boards. Microstrip traces and strip line traces can be employed to form transmission lines having characteristic impedances on the order of about $50\Omega$–$70\Omega$. Such transmission lines usually have their opposite ends terminated in their characteristic impedance. Because of the parallel resistive terminations, the effective resistance of the transmission line may be as low as $25\Omega$–$35\Omega$.

A data transceiver is a read/write terminal capable of transmitting information to and receiving information from the transmission medium. A transceiver typically includes a line driver stage (or simply "driver") and a receiver stage (or simply "receiver"). The common purpose of transmission line drivers and receivers is to transmit data quickly and reliably through a variety of environments over electrically long distances. This task is complicated by the fact that externally introduced noise and ground shifts can severely degrade the data.

Drivers amplify digital signal outputs from the VLSI circuitry so that the signals can be properly transmitted on the transmission medium. Receivers are typically differential amplifiers that receive signals from the transmission medium and provide outputs to the VLSI circuitry that are representative of digital information received from the medium.

Conventional drivers usually include level shifting capability to provide compatibility with different integrated circuit technologies. Specifically, before a driver transmits a signal across a transmission medium, the driver changes the nominal voltage swing (or the "dynamic signal range") utilized by the VLSI circuitry, e.g., CMOS, TTL, ECL, etc., to a different voltage swing that is utilized by the transmission medium. Thus, a driver not only amplifies a digital signal, but it changes the nominal voltage swing of the signal as well.

A different nominal voltage swing is normally used when transmitting data across a transmission medium in order to conserve power. Specifically, the power internally dissipated by the driver is proportional to the nominal voltage swing of the binary signal it applies to the transmission line. Therefore, power dissipation is reduced if the driver transmits a signal having a relatively small voltage swing over the transmission line.

It has become common for signals to be transmitted over transmission lines at BTL (Backplane Transceiver Logic) signal levels. The signal level standard is denoted "Backplane" because BTL has been used primarily in the backplane buses of mother boards. Because the nominal voltage swing of BTL is 1.0 Volt (logic low) to 2.1 Volts (logic high), power dissipation is less than it would be if the signals were transmitted over the transmission lines at CMOS (0 Volts to 3.3 Volts, or, 0 Volts to 5 Volts) or TTL (0 volts to 3.5 Volts) signal levels.

FIG. 1 illustrates a prior art BTL driver 20. The driver 20 receives CMOS level signals at input $V_{IN}$ and outputs BTL level signals to a transmission line 22 at output $V_{OUT}$. The driver 20 is implemented with bipolar transistors Q1, Q2, Q3, Q4, and Q5. Transistors Q1, Q2, and Q4 are Schottky bipolar transistors. Bipolar technology is attractive for implementing I/O devices, such as line or bus drivers, because of its unique high current gain characteristic. High current gain is important in a bus system, such as future bus backplane, because the driver 20 must be capable of driving the transmission line in both unloaded and loaded conditions.

Transistors Q2, Q3, Q4, and Q5 form an input stage 24 which controls the output transistor Q1. The input stage 24 charges and discharges the base of transistor Q1 in order to switch it on and off. FIG. 2 shows the input $V_{IN}$ and corresponding output $V_{OUT}$ waveforms for the driver 20. The driver 20 is an inverter. When the input $V_{IN}$ is low, the output transistor Q1 does not conduct current which causes the output $V_{OUT}$ to be high. When the input $V_{IN}$ is high, the output transistor Q1 conducts current which causes the output $V_{OUT}$ to go low.

The output $V_{OUT}$ falling edge propagation delay time $T_{pHL}$ is defined as the time between the 50% level of the input $V_{IN}$ rising edge and the 50% level of the output $V_{OUT}$ falling edge. The falling edge propagation delay time $T_{pHL}$ may also be referred to as the output $V_{OUT}$ turn-on time $T_{ON}$ because the output transistor Q1 is turning on during this time period. The output $V_{OUT}$ rising edge propagation delay time $T_{pHL}$ is defined as the time between the 50% level of the input $V_{IN}$ falling edge and the 50% level of the output $V_{OUT}$ rising edge. The rising edge propagation delay time $T_{pHL}$ may also be referred to as the output $V_{OUT}$ turn-off time $T_{OFF}$ because the output transistor Q1 is turning off during this time period. The delay times $T_{pHL}$ and $T_{pHL}$ should each normally be less than or equal to 5.0 nanoseconds (ns).

It is advantageous for the driver 20 to have a tight skew time $T_{skew}$. The skew time $T_{skew}$ is given by the equation:

$$T_{skew} = T_{pHL} - T_{pLH} \qquad (1)$$

The skew time $T_{skew}$ should typically be less than or equal to 2.0 ns over commercial voltage supply $V_{CC}$ and temperature ranges. Thus, the difference between the propagation delay times $T_{pHL}$ and $T_{pLH}$ should preferably be small and remain small during voltage supply $V_{CC}$ and temperature variations.

Because the output transistor Q1 of the driver 20 is a bipolar transistor, the propagation delay times $T_{pHL}$ and $T_{pLH}$ are affected by the bipolar transistor's current gain and storage time. Specifically, FIG. 2 illustrates the driver 20 output $V_{OUTht}$ during an increase in temperature. Temperature variations may be in the form of ambient temperature variations, i.e., variations in the temperature of the air surrounding integrated circuits, and/or junction temperature variations, i.e., variations in the temperature of the silicon in an integrated circuit. Ambient temperature variations can cause junction temperature variations, and vice versa.

The increased temperature causes the beta $\beta_{Q1}$ of transistor Q1 to increase. An increase in $\beta_{Q1}$ causes an increase in the excess base current $I_{xbQ1}$ of transistor Q1 which significantly increases transistor Q1's base over-drive. Such an increase in transistor Q1's base over-drive causes transistor Q1 to switch on more quickly which decreases the falling edge propagation delay time $T_{pHL}$.

However, the increase in the excess base current $I_{xbQ1}$ of transistor Q1 due to the temperature increase causes more storage charge to accumulate between the collector and base (the collector-base region) of transistor Q1. The accumulation of storage charge in the collector-base region causes transistor Q1 to switch off more slowly which increases the rising edge propagation delay time $T_{pLH}$. Thus, when temperature increases, the skew time $T_{skew}$ tends to increase because the falling edge propagation delay time $T_{pHL}$ decreases and the rising edge propagation delay time $T_{pHL}$ increases.

On the other hand, FIG. 2 illustrates the driver 20 output $V_{OUT1t}$ during a decrease in temperature. The decreased temperature causes $\beta_{Q1}$ of transistor Q1 to decrease which decreases the excess base current $I_{xbQ1}$ of transistor Q1. This decreases transistor Q1's base over-drive. Such a decrease in transistor Q1's base over-drive causes transistor Q1 to switch on more slowly which increases the falling edge propagation delay time $T_{pHL}$. However, the decrease in the excess base current $I_{xbQ1}$ of transistor Q1 causes less storage charge to accumulate in transistor Q1's collector-base region. The reduction in the accumulation of storage charge causes transistor Q1 to switch off more quickly which decreases the rising edge propagation delay time $T_{pLH}$. Thus, when temperature decreases, the skew time $T_{skew}$ tends to increase because the falling edge propagation delay time $T_{pHL}$ increases and the rising edge propagation delay time $T_{pHL}$ decreases.

Variations in the voltage supply $V_{CC}$ have a similar effect on the driver 20's skew time $T_{skew}$.

In an attempt to provide some control over the skew time $T_{skew}$ during temperature and voltage supply $V_{CC}$ variations, a Schottky diode D17 is connected between resistor R18 and ground. The Schottky diode D17 is intended to compensate for decreases in the base-emitter voltage $V_{beQ1}$ in order to maintain a relatively constant voltage $V_{R18}$ across resistor R18 during temperature increases. By maintaining a relatively constant voltage $V_{R18}$, a relatively constant current $I_{R18}$ is maintained through resistor R18 which is supposed to divert some of the excess base current $I_{xbQ1}$ through resistor R18 to ground. The diversion of some of the excess base current $I_{xbQ1}$ is supposed to prevent a large accumulation of storage charge in transistor Q1's collector-base region. By preventing a large accumulation of storage charge, the output transistor Q1 is able to switch off at its normal speed resulting in the rising edge propagation delay time $T_{pLH}$ remaining fairly constant. Without the Schottky diode D17, the voltage $V_{R18}$, and thus the current $I_{R18}$ conducted by resistor R18, would decrease during temperature increases which would mean that very little, if any, of the excess base current $I_{xbQ1}$ would be diverted.

However, the Schottky diode D17 fails to provide control over the skew time $T_{skew}$ during temperature and voltage supply $V_{CC}$ variations. As mentioned above, when temperature increases, the excess base current $I_{xbQ1}$ of transistor Q1 increases. Even with the Schottky diode D17, the current $I_{R18}$ tends to decrease during temperature increases. The only effect of the Schottky diode D17 is to cause the current $I_{R18}$ not to decrease quite as much as it would if the Schottky diode D17 were not present. Because during temperature increases the current $I_{R18}$ decreases, or at best remains relatively constant, very little, if any, of the increased excess base current $I_{xbQ1}$ is actually diverted to ground. The failure of the excess base current $I_{xbQ1}$ to be diverted causes a large amount of storage charge to accumulate in transistor Q1's collector-base region.

Thus, there is a need for a circuit that can be used with a bipolar input/output device to maintain a relatively small skew time $T_{skew}$ during temperature and/or voltage supply $V_{CC}$ variations.

SUMMARY OF THE INVENTION

The present invention provides a storage charge reduction circuit for reducing the storage charge of a first bipolar transistor. The storage charge reduction circuit includes a second field effect transistor connectable between the base of the first bipolar transistor and ground. The second field effect transistor conducts a compensation current from the base of the first bipolar transistor to ground. A third bipolar transistor is connected in series with a first resistor for conducting a first current from a first voltage supply through the first resistor to ground. Current mirror circuitry sets the gate-source voltage of the second field effect transistor so that the compensation current is proportional to the first current. The first current and the compensation current increase when temperature increases.

In another embodiment, the present invention provides a driver for providing binary signals from a data system to a transmission line. The driver includes an output bipolar transistor connectable between the transmission line and ground for conducting current from the transmission line to ground. An input stage charges and discharges the base of the output bipolar transistor. A storage charge reduction stage conducts a compensation current from the base of the output bipolar transistor to ground to reduce the storage charge of a first bipolar transistor. The compensation current has a positive temperature coefficient.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

Figure 3:
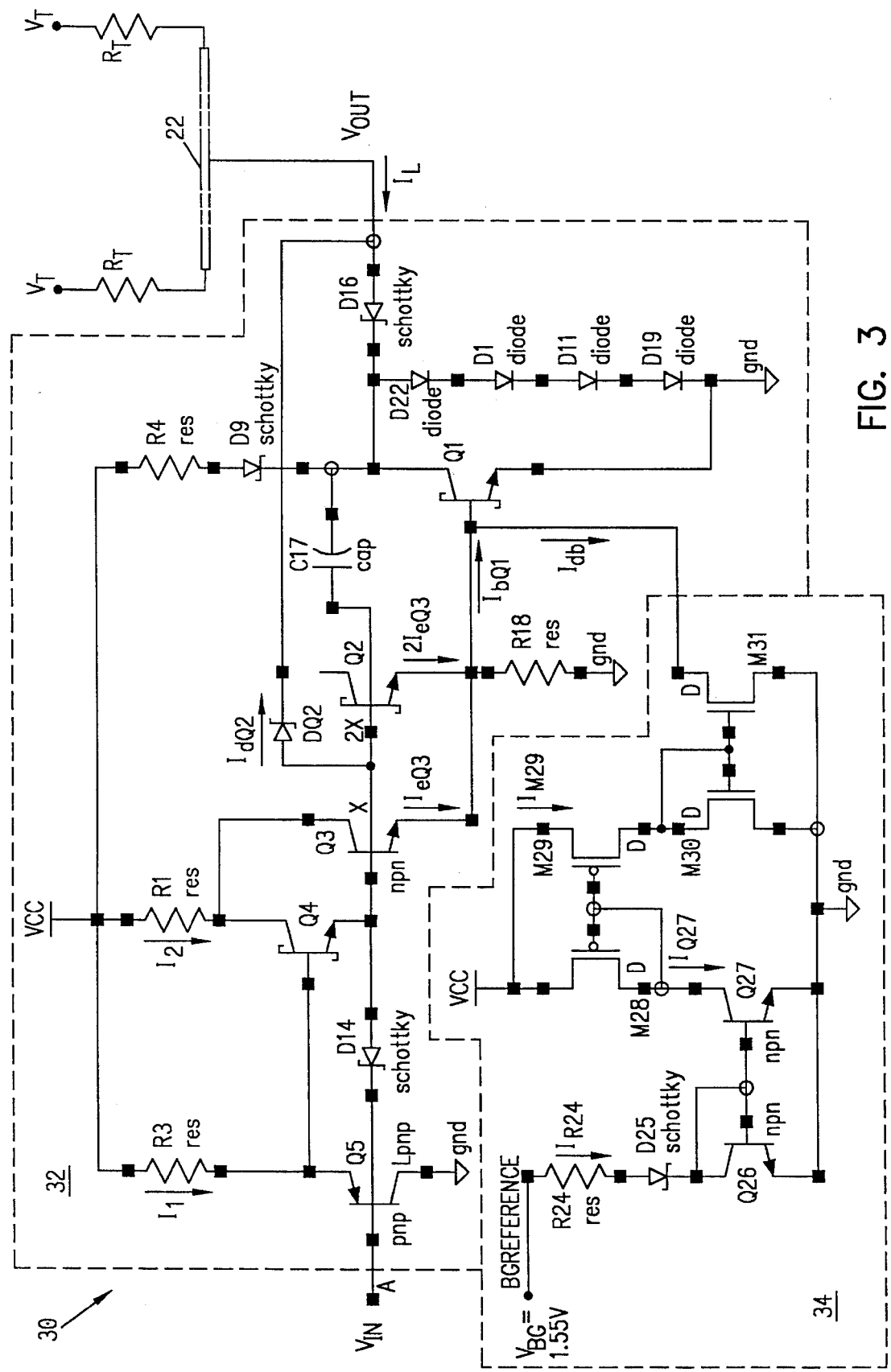
FIG. 3 is a schematic diagram of a bus and transmission line driver and a storage charge reduction circuit in accordance with the present invention.

FIG. 3 illustrates a driver 30 having a storage charge reduction stage 34 in accordance with the present invention. The driver 30 is a BTL driver in that it receives CMOS level signals at input $V_{IN}$ and outputs BTL level signals to a transmission line 22 at output $V_{OUT}$. The driver 30 overcomes the disadvantages of the driver 20 discussed above in that a relatively low skew time $T_{skew}$ is maintained during temperature and voltage supply $V_{CC}$ variations. The driver 30 is particularly effective in reducing the rising edge propagation delay time $T_{pLH}$ during temperature increases.

The driver 30 includes a driver stage 32 and a storage charge reduction stage 34. In general, the storage charge reduction stage 34 conducts a compensation current $I_{db}$ from the base of transistor Q1 to ground. By drawing the compensation current $I_{db}$ off of the base of transistor Q1, the total base current of transistor Q1 is reduced. Reducing the total base current of transistor Q1 reduces the amount of storage charge that accumulates in the collector-base region of transistor Q1. Because the storage charge is reduced, transistor Q1 can turn off more quickly which decreases the rising edge propagation delay time $T_{pHL}$. As will be discussed in detail below, as temperature increases, the storage charge reduction stage 34 increases the compensation current $I_{db}$. The increased compensation current $I_{db}$ further reduces the storage charge of transistor Q1 to offset the effects of the higher temperature.

Figure 1:
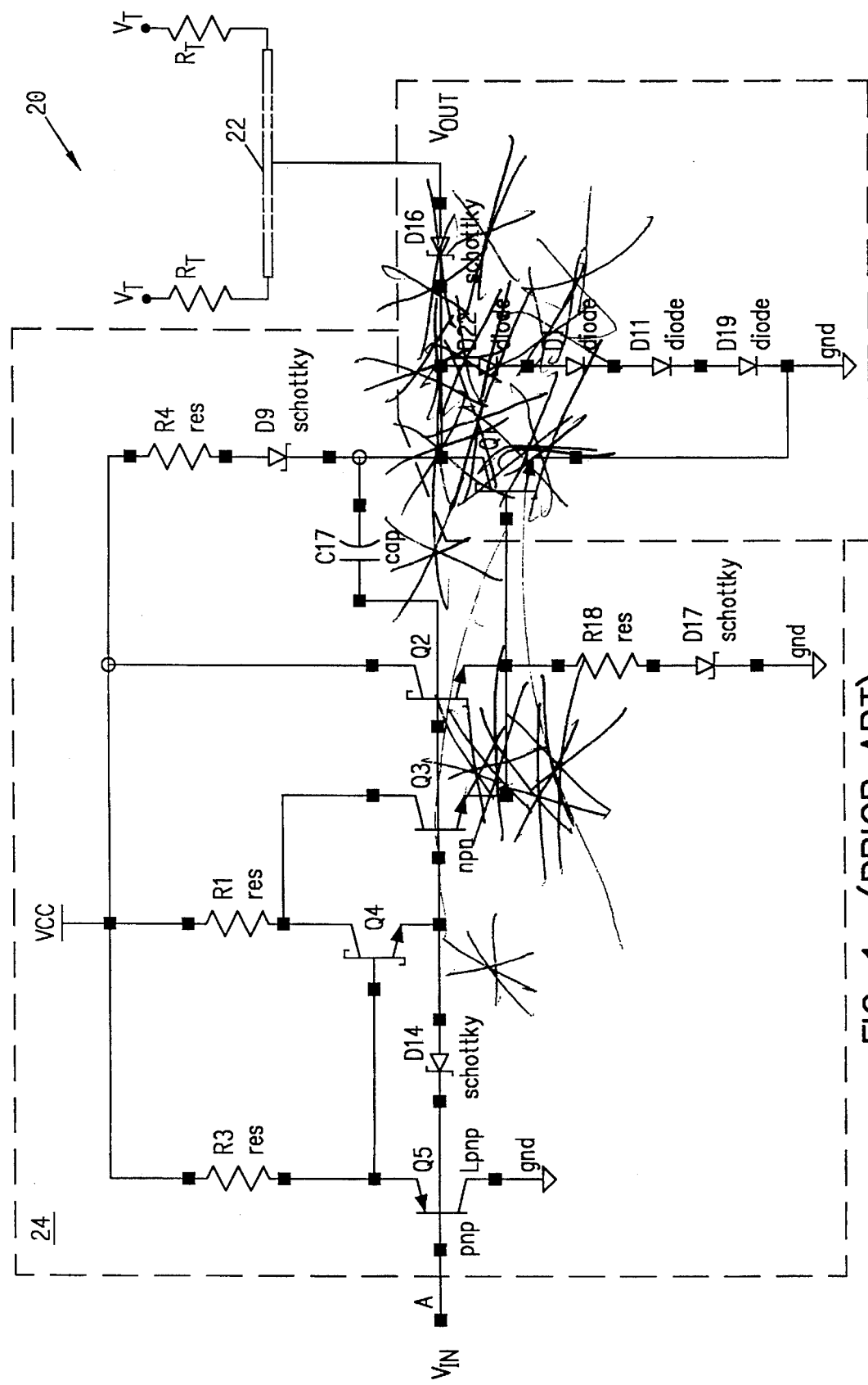
FIG. 1 is a schematic diagram of a prior art bus and transmission line driver.
Figure 2:
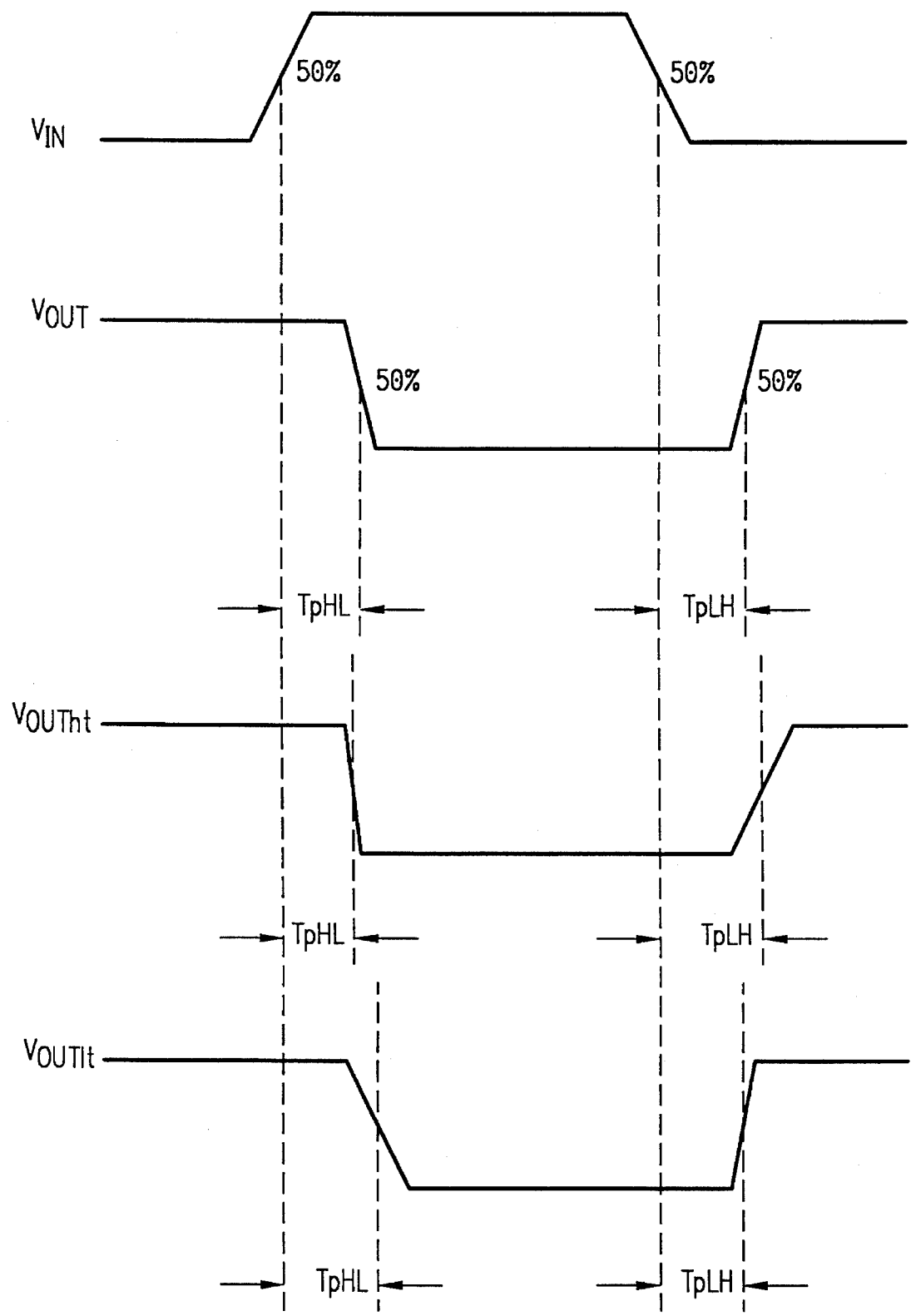
FIG. 2 is a timing diagram illustrating the input and output waveforms of the driver shown in FIG. 1.

The operation of the driver stage 32 is substantially similar to the operation of the driver 20 shown in FIG. 1. Specifically, when a high signal is received at the input $V_{IN}$, the output Schottky bipolar transistor Q1 is switched into the conducting state which pulls the output $V_{OUT}$ low. On the other hand, when the input $V_{IN}$ receives a low signal, the output transistor Q1 does not conduct current which causes the output $V_{OUT}$ to remain high.

The driver 30, however, does have a couple of modifications over the driver 20. First, the Schottky diode D17 is removed. Because of the addition of the storage charge reduction stage 34, there is no need for the Schottky diode D17. Second, a BTL driver should preferably be capable of sinking a minimum load current $I_L$ of 80 mA. In order for the driver 20 to sink 80 mA of load current In, 8 mA of base current $I_{bQ1}$ is needed from the voltage supply $V_{CC}$. In order to conserve power, the driver 30 has the collector of the Schottky bipolar transistor Q2 connected to the output $V_{OUT}$ rather than the voltage supply $V_{CC}$. Power is conserved because during the turn-on period of the output transistor Q1, most of the base bias current $I_{bQ1}$ of transistor Q1 is provided by the output $V_{OUT}$ sinking load current $I_L$ rather than the voltage supply $V_{CC}$.

It should be noted that the Schottky transistor Q2 is shown in FIG. 3 as a regular bipolar transistor Q2 having a Schottky diode DQ2 connected across its base and collector. This is the equivalent of the Schottky transistor Q2 shown in FIG. 1.

The storage charge reduction stage 34 includes an n-channel transistor M31 for conducting the compensation current $I_{db}$. The source of transistor M31 is grounded and its drain is connected to the base of transistor Q1. The amount of current $I_{db}$ conducted by transistor M31 is set by the mirror action between transistor M31 and another n-channel transistor M30. Transistor M30 has its source grounded, its gate connected to its drain, and its gate connected to the gate of transistor M31.

The drain of transistor M30 is connected to the drain of a p-channel transistor M29 which has its source connected to the voltage supply $V_{CC}$. The amount of current conducted by the source-drain circuit of transistor M29 is set by the mirror action between transistor M29 and another p-channel transistor M28. Transistor M28 has its source connected to the voltage supply $V_{CC}$, its gate connected to its drain, and its gate connected to the gate of transistor M29.

The drain of transistor M28 is connected to the collector of an npn bipolar transistor Q27 which has its emitter grounded. The amount of current conducted by transistor Q27 is set by the mirror action between transistor Q27 and another npn bipolar transistor Q26. Transistor Q26 has its emitter grounded, its base connected to its collector, and its base connected to the base of transistor Q27. The collector of transistor Q26 is connected to the cathode of a Schottky diode D25. The anode of the Schottky diode D25 is connected through a 600 Ω resistor R24 to a 1.55 Volt bandgap reference voltage supply $V_{BG}$. It Should be noted that the 1.55 Volt bandgap reference voltage supply $V_{BG}$ is preferably independent of, and not affected by, temperature and/or voltage supply $V_{CC}$ variations.

During operation, the current $I_{R24}$ conducted by the resistor R24 is given by the equation:

$$I_{R24} = (1.55 - V_{D25} - V_{beQ26})/R24 \quad (2)$$

where $V_{D25}$ is the voltage across the Schottky diode D25 and $V_{beQ26}$ is the base-emitter voltage of transistor Q26. Using equation (2), the current $I_{R24}$ will typically be approximately equal to:

$$\begin{aligned}I_{R24} &= (1.55 - 0.5 - 0.75)/600 \, \Omega \\ &= 0.30 \, V/600 \, \Omega \\ &= 0.5 \, mA\end{aligned}$$

When temperature increases, the voltage $V_{D25}$ across the Schottky diode D25 and the base-emitter voltage $V_{beQ26}$ Of transistor Q26 both decrease. As mentioned above, the band gap reference voltage $V_{BG}$ is temperature independent. According to equation (3), if the voltages $V_{D25}$ and $V_{beQ26}$ both decrease, then the current $I_{R24}$ increases. Therefore, the current $I_{R24}$ has a positive temperature coefficient; i.e., when temperature increases, the current $I_{R24}$ increases, and when temperature decreases, the current $I_{R24}$ decreases. Furthermore, because the band gap reference voltage supply $V_{BG}$ is independent of variations in the voltage supply $V_{CC}$, the current $I_{R24}$ is also independent of variations in the voltage supply $V_{CC}$.

Because of the mirror action between transistors Q26 and Q27, M28 and M29, and M30 and M31, the compensation current $I_{db}$ conducted by transistor M31 is proportional to the current $I_{R24}$ conducted by resistor R24. Specifically, the compensation current $I_{db}$ is given by the equation:

$$I_{db} = K (I_{R24}) \quad (3)$$

where K is a constant which is determined by the sizes of the transistors Q26, Q27, M28, M29, M30, and M31. Specifically, the base-emitter voltages of transistors Q26 and Q27 are equal. If transistors Q26 and Q27 are of equal size, then the current $I_{Q27}$ conducted by transistor Q27 will be equal to the current $I_{R24}$. However, if transistor Q27 is larger or smaller than transistor Q26, then the current $I_{Q27}$ will be larger or smaller, respectively. Similarly, the source-gate voltages of transistors M28 and M29 are equal. The currents $I_{Q27}$, conducted by transistor M28, and $I_{M29}$, conducted by transistor M29, are proportional to each other and one or the other can be made larger or smaller by adjusting the channel sizes of transistor M28 and M29. Lastly, the gate-source voltages of transistors M30 and M31 are equal, and so the current $I_{M29}$ conducted by transistor M30 and the compensation current $I_{db}$ conducted by transistor M31 are also proportional to each other.

Because the compensation current $I_{db}$ is proportional to the current $I_{R24}$, the compensation current $I_{db}$ also has a positive temperature coefficient. However, although the current $I_{R24}$ is independent of variations in the voltage supply $V_{CC}$, such variations in the voltage supply $V_{CC}$ do have a secondary effect on the compensation current $I_{db}$. Specifically, an increase in the voltage supply $V_{CC}$ tends to increase the currents $I_{Q27}$ and $I_{M29}$ conducted by the transistors M28 and Q27, and M29 and M30, respectively. Such an increase in the currents $I_{Q27}$ and $I_{M29}$ increases the compensation current $I_{db}$ due to the mirror action of transistors M30 and M31. However, the effect of variations in the voltage supply $V_{CC}$ on the compensation current $I_{db}$ is minor.

As mentioned above, the storage charge reduction stage 34 conducts the compensation current $I_{db}$ from the base of transistor Q1 to ground in order to reduce the amount of storage charge that accumulates in the collector-base region of transistor Q1. This reduction in transistor Q1's storage charge decreases the rising edge propagation delay time $T_{pLH}$. In order to illustrate the increased accumulation of storage charge in transistor Q1 during temperature increases, the base current $I_{bQ1}$ must be analyzed to illustrate its separate components. According to Kirchhoff's current law, the base current $I_{bQ1}$ of transistor Q1 is given by the equation:

$$i\ I_{bQ1} = I_{eQ3} + I_{eQ2} - I_{db} \quad (4)$$

where $I_{eQ3}$ is the emitter current of transistor Q3 and $I_{eQ2}$ is the emitter current of transistor Q2. If the $\beta_{Q2}$ of transistor Q2 is twice as large as the $\beta_{Q3}$ of transistor Q3, then:

$$I_{eQ2} = 2\ (I_{eQ3}) \quad (5)$$

Furthermore, according to Kirchhoff's current law, the emitter current $I_{eQ3}$ of transistor Q3 is given by the equation:

$$I_{eQ3} = I_1 - I_{dQ2} \quad (6)$$

where $I_1$ is the current conducted by the resistor R3, $I_2$ is the current conducted by the resistor R1, and $I_{dQ2}$ is the current conducted by the Schottky diode DQ2 associated with the Schottky transistor Q2. Substituting equations (5) and (6) into equation (4) gives the following equation:

$$I_{bQ1} = 3\ (I_1 + I_2 - I_{dQ2}) - I_{db} \quad (7)$$

According to bipolar transistor theory, the base current $I_{bQ1}$ of transistor Q1 is given by the equation:

$$I_{bQ1} \approx I_{xbQ1} + (I_L/\beta_{Q1}) \quad (8)$$

where $I_{xbQ1}$ is the excess base current of transistor Q1, $I_L$ is the load current which is equal to the collector current of transistor Q1, and $\beta_{Q1}$ is the beta of transistor Q1. The quantity $I_L/\beta_{Q1}$ is the active base current of transistor Q1. Substituting equation (8) into equation (7) and solving for the excess base current $I_{xbQ1}$ gives the following equation:

$$I_{xbQ1} = 3\ (I_1 + I_2 - I_{dQ2}) - [I_{db} + (I_L/\beta_{Q1})] \quad (9)$$

Assuming initially that there is no compensation current $I_{db}$, i.e., $I_{db}=0$, when temperature increases, the beta $\beta_{Q1}$ of transistor Q1 increases. The increase in $\beta_{Q1}$ causes the active base current $I_L/\beta_{Q1}$ of transistor Q1 to decrease. A decrease in the active base current $I_L/\beta_{Q1}$ causes the excess base current $I_{xbQ1}$ of transistor Q1 to increase. The increase in the excess base current $I_{xbQ1}$ causes an increase in the accumulation of storage charge in the collector-base region of transistor Q1. As mentioned above, an increase in the storage charge causes the rising edge propagation delay time $T_{pLH}$ to increase because the output transistor Q1 cannot switch off as quickly.

Assuming, however, that the compensation current $I_{db}$ is utilized, as temperature increases, the compensation current $I_{db}$ preferably increases more than the active base current $I_L/\beta_{Q1}$ decreases. This causes the excess base current $I_{xbQ1}$ to decrease which reduces the amount of storage charge that accumulates in the collector-base region of transistor Q1. By reducing the amount of storage charge that accumulates in transistor Q1, transistor Q1 is able to switch off more quickly which means that the rising edge propagation delay time $T_{pLH}$ either remains relatively unchanged or increases less than if there is no compensation current $I_{db}$.

Preferably, as temperature increases, the compensation current $I_{db}$ increases more than the active base current $I_L/\beta_{Q1}$ decreases. As discussed above, the compensation current $I_{db}$ has a positive temperature coefficient because the current $I_{R24}$ has a positive temperature coefficient. The strength of the current $I_{db}$ is set by adjusting the sizes of the mirror transistors Q26 and Q27, M28 and M29, and M30 and M31.

Figure 4A:
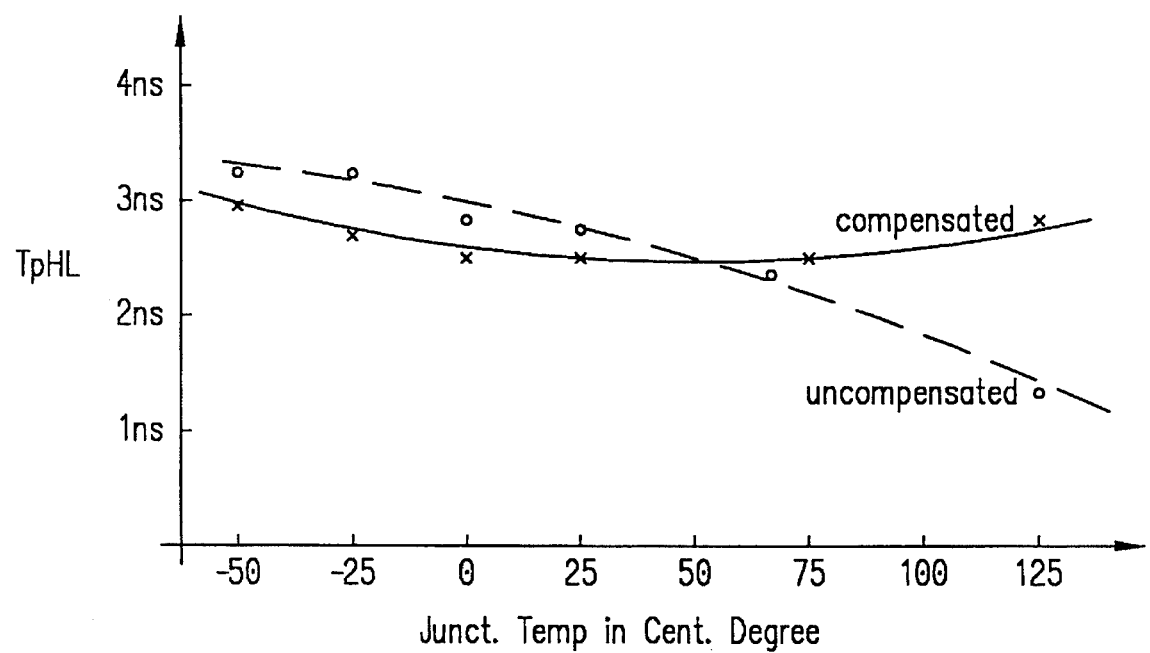
FIGS. 4A and 4B are plots of the propagation delay times versus temperature for the driver shown in FIG. 3.

FIG. 4A shows the falling edge propagation delay time $T_{pHL}$ of the driver 30 plotted against the junction temperature in °C. for both the uncompensated, i.e., $I_{db}=0$, and the compensated, i.e., $I_{db}\neq 0$, conditions. For the uncompensated condition, as temperature increases, the falling edge propagation delay time $TpH_L$ decreases because the output transistor Q1 is able to switch on more quickly as its $\beta_{Q1}$ increases. However, for the compensated condition, i.e., when the compensation current $I_{db}$ is drawn off of the base of transistor Q1, the falling edge propagation delay time $T_{pHL}$ remains relatively constant as the temperature increases from 0° C. to 75° C. The compensation current $I_{db}$ causes the falling edge propagation delay time $T_{pHL}$ to remain relatively constant because the total base current $I_{bQ1}$ of transistor Q1 is reduced which causes transistor Q1 to switch on more slowly.

Figure 4B:
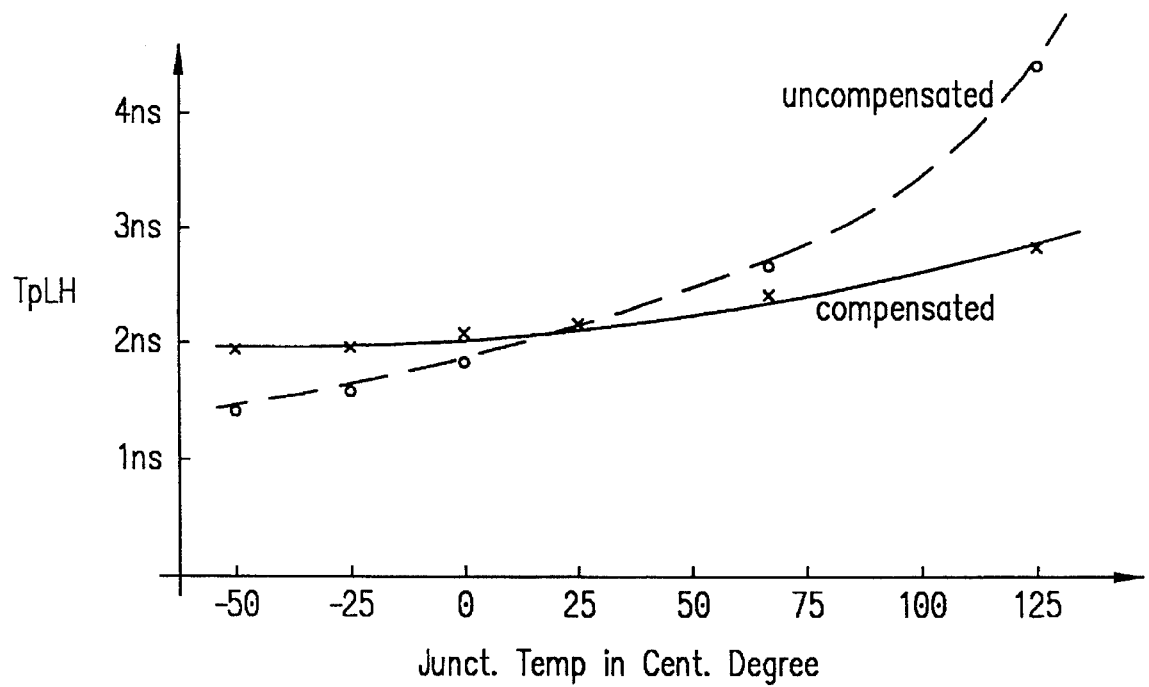
Figure 1:
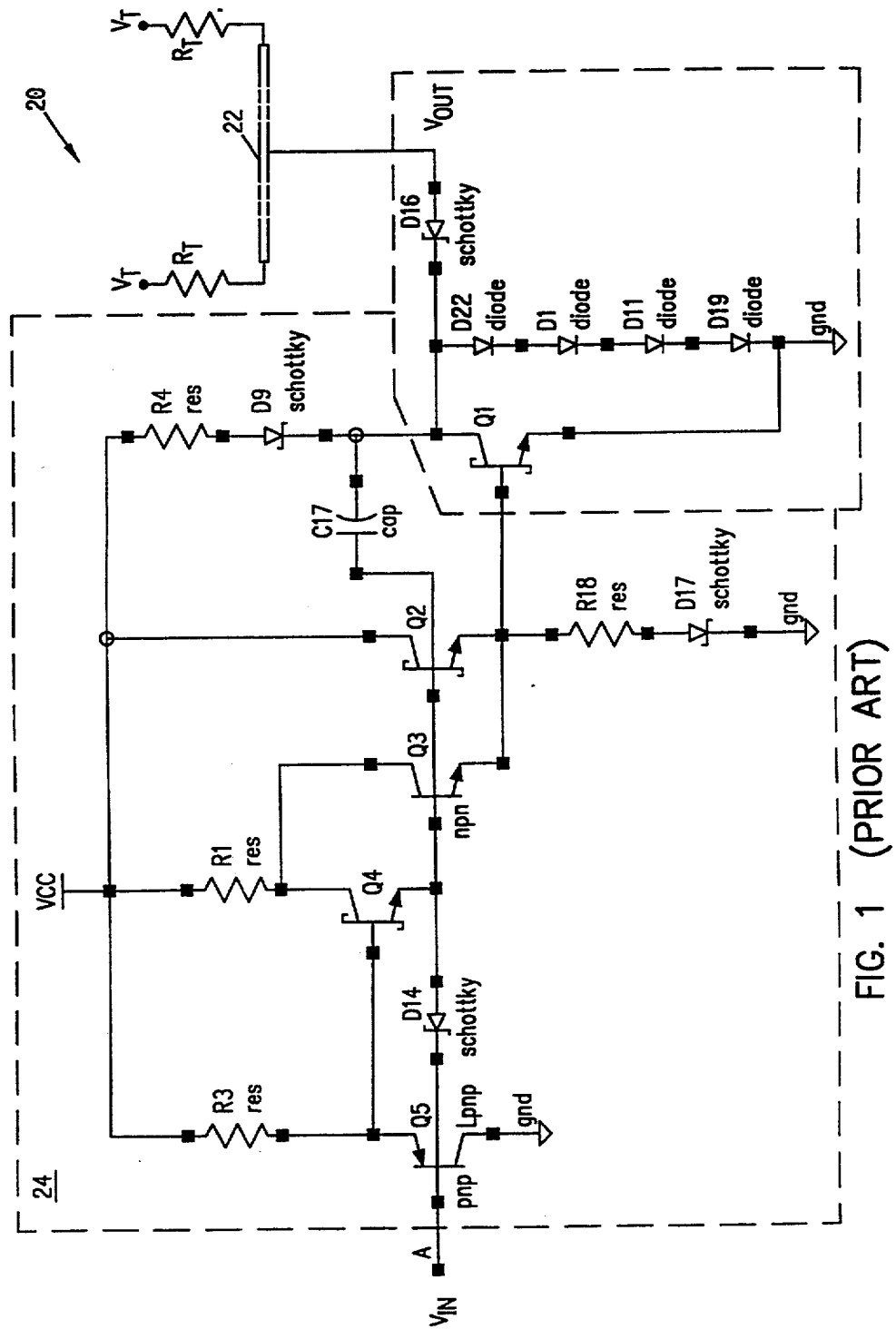

FIG. 4B shows the rising edge propagation delay time $T_{pLH}$ of the driver 30 plotted against the junction temperature in °C. for both the uncompensated and the compensated conditions. For the uncompensated condition, as temperature increases, the rising edge propagation delay time $T_{pLh}$ increases substantially because, due to the larger $\beta_{Q1}$, more storage charge accumulates in the collector-base region of transistor Q1. Because of the accumulation of storage charge, transistor Q1 switches off more slowly. However, for the compensated condition, the rising edge propagation delay time $T_{pLH}$ does not increase as quickly for rising temperature as it does for the uncompensated condition. Because of the compensation current $I_{db}$, less storage charge is permitted to accumulate which causes transistor Q1 to switch off more quickly.

Although the storage charge reduction stage 34 is shown herein as part of the BTL driver 30, it should be understood that the storage charge reduction stage 34 may be used to provide storage charge reduction to nearly any input/output bipolar device in order to, for example, improve skew time $T_{skew}$ and to obtain good data pulse fidelity. The storage charge reduction stage 34, which provides the compensation current $I_{db}$ having a positive temperature coefficient, permits a saturated bipolar transistor to be turned off quickly without degrading its DC performance. The compensation current $I_{db}$ reduces storage charge because a bipolar transistor's base is biased inversely proportional to temperature and current gain change.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A storage charge reduction circuit for reducing the storage charge of a first bipolar transistor, comprising:

a first field effect transistor connectable to the base of the first bipolar transistor and connected to a ground node for conducting a compensation current from the base of the first bipolar transistor to the ground node;

a first resistor;

a first Schottky diode connected in series with the first resistor;

a second bipolar transistor connected in series with the first resistor and the first Schottky diode for conducting a first current from a first voltage supply through the first resistor and the first Schottky diode to the ground node, the second bipolar transistor having its base connected to its collector so that an increase in temperature causes a decrease in a base-emitter voltage of the second bipolar transistor and an increase in the first current;

current mirror circuitry which couples the second bipolar transistor to the first field effect transistor and which sets the gate-source voltage of the first field effect transistor so that the compensation current is proportional to the first current so that the compensation current increases in response to the first current increasing.

2. A storage charge reduction circuit in accordance with claim 1, wherein the first voltage supply is temperature independent.

3. A storage charge reduction circuit in accordance with claim 1, wherein the first field effect transistor is an n-channel transistor.

4. A storage charge reduction circuit in accordance with claim 1, wherein the second bipolar transistor is an npn transistor.

5. A storage charge reduction circuit for reducing the storage charge of a first bipolar transistor, comprising:

a first field effect trransistor connectable to the base of the first bipolar transistor and connected to a ground node for conducting a compensation current from the base of the first bipolar transistor to the ground node;

a first resistor;

a second bipolar transistor connected in series with the first resistor for conducting a first current from a first voltage supply through the first resistor to the ground node, the second bipolar transistor having its base connected to its collector so that an increase in temperature causes a decrease in a base-emitter voltage of the second bipolar transistor and an increase in the first currrent; and current mirror circuitry which couples the second bipolar transistor to the first field effect transistor and which sets the gate-source voltage of the first field effect transistor so that the compensation current is proportional to the first current so that the compensation current increases in response to the first current increasing;

wherein the current mirror circuitry includes:

a third bipolar transistor for conducting a second current, the third bipolar transistor having its base connected to the base of the second bipolar transistor so that the base-emitter voltages of the second and third bipolar transistors are substantially equal;

a second field effect transistor connected in series with the third bipolar transistor for conducting the second current;

a third field effect transistor for conducting a third current, the third field effect transistor having its gate connected to the gate of the second field effect transistor so that the gate-source voltages of the second and third field effect transistors are substantially equal; and a fourth field effect transistor connected in series with the third field effect transistor for conducting the third current, the fourth field effect transistor having its gate connected to the gate of the first field effect transistor so that the gate-source voltages of the fourth and first field effect transistors are substantially equal.

6. A storage charge reduction circuit in accordance with claim 5, wherein:

the third bipolar transistor is an npn transistor;

the second field effect transistor is a p-channel transistor;

the third field effect transistor is a p-channel transistor; and the fourth field effect transistor is an n-channel transistor.

7. A driver for providing binary signals from a data system to a transmission line, the driver comprising:

an output bipolar transistor connectable to the transmission line and connected to a ground node for conducting current from the transmission line to the ground node;

an input stage for charging and discharging the base of the output bipolar transistor; and a storage charge reduction stage for conducting a compensation current from the base of the output bipolar transistor to the ground node to reduce the storage charge of the output bipolar transistor, the compensation current having a positive temperature coefficient;

wherein the storage charge reduction stage includes:

a first field effect transistor connected between the base of the output bipolar transistor and the ground node for conducting the compensation current from the base of the output bipolar transistor to the ground node;

a first resistor;

a first bipolar transistor connected in series with the first resistor for conducting a first current from a first voltage supply through the first resistor to the ground node, the first bipolar transistor having its base connected to its collector so that an increase in temperature causes a decrease in a base-emitter voltage of the first bipolar transistor and an increase in the first current;

current mirror circuitry which couples the first bipolar transistor to the first field effect transistor and which sets the gate-source voltage of the first field effect transistor so that the compensation current is proportional to the first current so that the compensation current increases in response to the first current increasing, the current mirror circuitry including a second bipolar transistor for conducting a second current, the second bipolar transistor having its base connected to the base of the first bipolar transistor so that the base-emitter voltages of the first and second bipolar transistors are substantially equal; and A first Schottky diode connected in series between the first resistor and the first bipolar transistor.

8. A driver in accordance with claim 7, wherein the first voltage supply is temperature independent.

9. A driver in accordance with claim 7, wherein the first field effect transistor is an n-channel transistor.

10. A driver in accordance with claim 7, wherein the first bipolar is an npn transistor.

11. A driver for providing binary signals from a data system to a transmission line, the driver comprising:

an output bipolar transistor connectable to the transmission line and connected to a ground node for conducting current from the transmission line to the ground node;

an input stage for charging and discharging the base of the output bipolar transistor; and a storage charge reduction stage for conducting a compensation current from the base of the output bipolar transistor to the ground node to reduce the storage charge of the output bipolar transistor, the compensation current having a positive temperature coefficient;

wherein the storage charge reduction stage includes:
  a first field effect transistor connected between the base of the output bipolar transistor and the ground node for conducting the compensation current from the base of the output bipolar transistor to the ground node;
  a first resistor;

a first bipolar transistor connected in series with the first resistor for conducting a first current from a first voltage supply through the first resistor to the ground node, the first bipolar transistor having its base connected to its collector so that an increase in temperature causes a decrease in a base-emitter voltage of the first bipolar transistor and an increase in the first current; and current mirror circuitry which couples the first bipolar transistor to the first field effect transistor and which sets the gate-source voltage of the first field effect transistor so that the compensation current is proportional to the first current so that the compensation current increases in response to the first current increasing;

wherein the current mirror circuitry includes:
  a second bipolar transistor for conducting a second current, the second bipolar transistor having its base connected to the base of the first bipolar transistor so that the base-emitter voltages of the first and second bipolar transistors are substantially equal;
  a second field effect transistor connected in series with the second bipolar transistor for conducting the second current;
  a third field effect transistor for conducting a third current, the third field effect transistor having its gate connected to the gate of the second field effect transistor so that the gate-source voltages of the second and third field effect transistors are substantially equal; and
  a fourth field effect transistor connected in series with the third field effect transistor for conducting the third current, the fourth field effect transistor having its gate connected to the gate of the first field effect transistor so that the gate-source voltages of the fourth and first field effect transistors are substantially equal.

12. A driver for providing binary signals from a data system to a transmission line, the driver comprising:

an output bipolar transistor connectable to the transmission line and connected to a ground node for conducting current from the the transmission line to the ground node;

an input stage for charging and discharging the base of the output transistor;

a first field effect transistor connected between the base of the output bipolar transistor and the ground node for conducting a compensation current from the base of the output bipolar transistor to the ground node to reduce the storage charge of the output bipolar transistor;

a first resistor;

a first bipolar transistor connected in series with the first resistor for conducting a first current from a first voltage supply through the first resistor to the ground node, the first bipolar transistor having its base connected to its collector so that an increase in temperature causes a decrease in a base-emitter voltage of the first bipolar transistor; and an increase in the first current;

current mirror circuitry which couples the first bipolar transistor to the first field effect transistor and which sets the gate-source voltage of the first field effect transistor so that the compensation current is proportional to the first current so that the compensation current increases in response to the first current increasing; and a first Schottky diode connected in series between the first resistor and the first bipolar transistor.

13. A driver in accordance with claim 12, wherein the first voltage supply its temperature independent.

14. A driver in accordance with claim 12, wherein the first field effect transistor is an n-channel transistor.

15. A driver in accordance with claim 12, wherein the first bipolar transistor is an npn transistor.

16. A driver for providing binary signals from a data system to a transmission line, the driver comprising:

an output bipolar transistor connectable to the transmission line and connected to a ground node for conducting current from the transmission line to the ground node;

an input stage for charging and discharging the base of the output bipolar transistor;

a first field effect transistor connected between the base of the output bipolar transistor and the ground node for conducting a compensation current from the base of the output bipolar transistor to the ground node to reduce the storage charge of the output bipolar transistor;

a first resistor;

a first bipolar transistor connected in series with the first resistor for conducting a first current from a first voltage supply through the first resistor to the ground node, the first bipolar transistor having its base connected to its collector so that an increase in temperature causes a decrease in base-emitter voltage of the first bipolar transistor and an increase in the first current;

current mirror circuitry which couples the first bipolar transistor to the first field effect transistor and which sets the gate-source voltage of the first field effect transistor so that the compensation current is proportional to the first current so that the compensation current increases in response to the first current increasing;

wherein the current mirror circuitry includes:
  a second bipolar transistor for conducting a second current, the second bipolar transistor having its base connected to the base of the first bipolar transistor so that the base-emitter voltages of the first and second bipolar transistors are substantially equal;
  a second field effect transistor connected in series with the second bipolar transistor for conducting the second current;

a third field effect transistor for conducting a third current, the third field effect transistor having its gate connected to the gate of the second field effect transistor so that the gate-source voltages of the second and third field effect transistors are substantially equal; and a fourth field effect transistor connected in series with the third field effect transistor for conducting the third current, the fourth field effect transistor having its gate connected to the gate of the first field effect transistor so that the gate-source voltages of the fourth and first field effect transistors are substantially equal.

17. A driver in accordance with claim 16, wherein:

the second bipolar transistor is an npn transistor;

the second field effect transistor is a p-channel transistor;

the third field effect transistor is a p-channel transistor; and the fourth field effect transistor is an n-channel transistor.

* * * * *

UNITED STATES PATENT AND TRADEMARK OFFICE
CERTIFICATE OF CORRECTION

PATENT NO. : 5,530,386
DATED : June 25, 1996
INVENTOR(S) : Kuo, et. al.

It is certified that error appears in the above-identified patent and that said Letters Patent is hereby corrected as shown below:

Drawings:

FIG. 1 should be deleted and substitute with the FIG. 1 as shown on the attached sheet.

Signed and Sealed this

Twenty-fourth Day of September, 1996

*Attest:*

BRUCE LEHMAN

*Attesting Officer*          *Commissioner of Patents and Trademarks*